United States Patent
Tsujimura et al.

(10) Patent No.: US 10,326,015 B2
(45) Date of Patent: Jun. 18, 2019

(54) SWITCHING ELEMENT AND METHOD OF MANUFACTURING THE SAME

(71) Applicant: TOYOTA JIDOSHA KABUSHIKI KAISHA, Toyota-shi, Aichi (JP)

(72) Inventors: Masatoshi Tsujimura, Nagoya (JP); Katsuhiro Kutsuki, Nagakute (JP); Sachiko Aoi, Nagakute (JP); Yasushi Urakami, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 9 days.

(21) Appl. No.: 15/855,081

(22) Filed: Dec. 27, 2017

(65) Prior Publication Data

US 2018/0240906 A1     Aug. 23, 2018

(30) Foreign Application Priority Data

Feb. 17, 2017 (JP) ................................. 2017-028107

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0623* (2013.01); *H01L 29/0692* (2013.01);
(Continued)

(58) Field of Classification Search
CPC ............. H01L 29/0692; H01L 29/0696; H01L 29/1608; H01L 29/4236; H01L 29/42368;
(Continued)

(56) References Cited

U.S. PATENT DOCUMENTS 8,198,676 B2 * 6/2012 Iwamuro ........... H01L 29/41741
257/330
8,963,234 B2 * 2/2015 Masuda .............. H01L 29/7827
257/330
(Continued)

FOREIGN PATENT DOCUMENTS

JP       2011-023675 A    2/2011
JP       2017-191817 A   10/2017

*Primary Examiner* — Stephen W Smoot
(74) *Attorney, Agent, or Firm* — Oliff PLC

(57) ABSTRACT

A switching element may include a semiconductor substrate, first and second trenches, a gate insulating layer, an interlayer insulating layer covering the semiconductor substrate, and an electrode on the interlayer insulating layer. A wide portion and a narrow portion may be arranged alternately between the first and second trenches. The interlayer insulating layer may include a contact hole in the wide portion. The electrode may be in contact with the semiconductor substrate within the contact hole. The semiconductor substrate may include an upper n-type region in contact with the gate insulating layer in the narrow portion and in contact with the electrode, a p-type body contact region in contact with the electrode, a p-type body region in contact with the gate insulating layer in the narrow portion, and a lower n-type region in contact with the gate insulating layer in the narrow portion.

6 Claims, 15 Drawing Sheets

(51) Int. Cl.
  *H01L 29/66* (2006.01)
  *H01L 29/16* (2006.01)
  *H01L 29/423* (2006.01)

(52) U.S. Cl.
  CPC ...... *H01L 29/0696* (2013.01); *H01L 29/1608* (2013.01); *H01L 29/4236* (2013.01); *H01L 29/4238* (2013.01); *H01L 29/42368* (2013.01); *H01L 29/66068* (2013.01); *H01L 29/66666* (2013.01); *H01L 29/66734* (2013.01); *H01L 29/7827* (2013.01)

(58) Field of Classification Search
  CPC ........... H01L 29/4238; H01L 29/66068; H01L 29/66666; H01L 29/66712; H01L 29/66734; H01L 29/7813; H01L 29/7827
  See application file for complete search history.

(56) References Cited

U.S. PATENT DOCUMENTS

| | | | |
|---|---|---|---|
| 9,853,024 B2 * | 12/2017 | Senoo | H01L 27/0664 |
| 2009/0078994 A1 * | 3/2009 | Takami | H01L 29/7813 257/330 |
| 2011/0018004 A1 | 1/2011 | Shimizu et al. | |
| 2011/0284954 A1 * | 11/2011 | Hsieh | H01L 29/0878 257/331 |
| 2016/0329323 A1 * | 11/2016 | Iwasaki | H01L 29/32 |
| 2018/0175149 A1 * | 6/2018 | Takaya | H01L 29/42368 |

* cited by examiner

SWITCHING ELEMENT AND METHOD OF MANUFACTURING THE SAME

TECHNICAL FIELD

The technique disclosed herein relates to a switching element and a method of manufacturing the same.

Japanese Patent Application Publication No. 2011-023675 (hereinbelow termed "Patent Literature 1") describes a switching element (more specifically, a MOSFET). This switching element includes a plurality of trenches provided in an upper surface of a semiconductor substrate. A gate insulating layer and a gate electrode are provided in each trench. An upper n-type region (source region) of n-type, a body region of p-type, and a lower n-type region (drift region) of n-type are provided in a semiconductor layer between each pair of the trenches. An interval between each pair of the trenches is narrowed so that the body region can be completely depleted upon when channels are generated.

SUMMARY

Generally in a gate type switching element, a depletion layer spreads from each gate insulating layer to a body region in a state where channels are generated. Further, in the state where channels are generated, a depletion layer also spreads to the body region from each of a pair of n-type regions (an upper n-type region and a lower n-type region) that interpose the p-type body region therebetween. Facileness of channel generation changes due to an influence of fixed charges (acceptor ions) existing in the depletion layer spreading from each of the pair of n-type regions to the body region. The channels are more easily generated when an influence of the depletion layer spreading from each of the pair of n-type regions is greater, resulting in a lower gate threshold (a minimum gate voltage required for generating the channels) for the switching element. Further, when a channel length is long, the influence of the depletion layer spreading from each of the pair of n-type regions becomes relatively small as compared to an influence of the depletion layer spreading from each gate insulating layer, and thus the gate threshold becomes higher. On the other hand, if the channel length is short, the gate threshold becomes lower because the influence of the depletion layer spreading from each of the pair of n-type regions becomes relatively great as compared to the influence of the depletion layer spreading from each gate insulating layer. As above, the gate threshold varies according to the channel length. Due to this, if variations are exhibited in the channel length during mass-production of the switching elements, variations will also exhibited in the gate threshold. Especially, when the channel length is made shorter than a predetermined value, the variations in the gate threshold become extremely large (which is a so-called short channel effect).

As aforementioned, in the switching element of Patent Literature 1, the interval between each pair of the trenches is narrowed. Due to this, when the channels are generated, an entirety of the body region is depleted by depletion layers spreading to the body region from the respective gate insulating layers. As above, by depleting the entirety of the body region, the influence of the depletion layers spreading to the body region from the pair of n-type regions can be suppressed. Thus, according to the structure of Patent Literature 1, the variations in the gate threshold caused by the variations in the channel length can be suppressed.

However, when an interval between two trenches is narrowed, it becomes difficult to form a contact hole for connecting to a semiconductor layer between those two trenches. That is, when the interval between the trenches is narrow, a width of the contact hole itself needs to be narrowed as well, which deteriorates profile accuracy of the contact hole. Further, since it is difficult to accurately form the contact hole in such a narrow interval, there may be a case where positional misalignment of the contact hole occurs. Due to this, it is difficult to suitably form the contact hole. For example, there is a risk that a semiconductor substrate and a gate electrode may short-circuit due to the positional misalignment of the contact hole.

In the switching element of Patent Literature 1, the contact hole is provided outside a range where the plurality of trenches is provided, and the upper n-type region (source region) and the body region are connected to an electrode within the contact hole. The body region is connected to the electrode via a body contact region (a p-type region with a high impurity concentration). According to this configuration, a wide contact hole can be provided, and thus the contact hole can be formed suitably. However, in this structure, a distance from a semiconductor region (the upper n-type region and the body region) located between the trenches to the contact hole becomes long. When the distance from the upper n-type region to the contact hole is long, there is a problem that an on-resistance becomes high. Further, when the distance from the body region located between the trenches to the contact hole is long, upon charges being generated in the drift region under the body region due to an avalanche effect, the charges do not flow easily to the contact hole. As a result, overcurrent caused by the avalanche effect is likely to occur in the drift region, and thus there is a problem that an avalanche resistance is low.

Thus, the disclosure herein provides a technique for switching elements that is capable of suppressing variations in a gate threshold by narrowing an interval between trenches, and that is capable of realizing a suitable contact with a semiconductor layer located between the trenches.

A switching element disclosed herein may comprise: a semiconductor substrate; a first trench provided in an upper surface of the semiconductor substrate; a second trench provided in the upper surface of the semiconductor substrate and arranged to be apart from the first trench; a first gate insulating layer covering an inner surface of the first trench; a second gate insulating layer covering an inner surface of the second trench; a first gate electrode arranged in the first trench and insulated from the semiconductor substrate by the first gate insulating layer, a second gate electrode arranged in the second trench and insulated from the semiconductor substrate by the second gate insulating layer, an interlayer insulating layer covering an upper surface of the first gate electrode, an upper surface of the second gate electrode and the upper surface of the semiconductor substrate; a first electrode arranged on the interlayer insulating layer, and a second electrode, wherein the upper surface of the semiconductor substrate may comprise a wide portion and a narrow portion that are arranged alternately between the first trench and the second trench, the narrow portion being a portion where an interval between the first trench and the second trench is narrower than an interval between the first trench and the second trench in the wide portion, the interlayer insulating layer may comprise a contact hole in the wide portion, the first electrode may be in contact with the semiconductor substrate within the contact hole, and the semiconductor substrate may comprise: an upper n-type region extending from the wide portion to the narrow portion, in contact with the first gate insulating layer and the second gate insulating layer in the narrow portion, and in contact with the first electrode within the contact hole in the wide portion; a p-type body contact region in contact with the first electrode within the contact hole in the wide portion; a p-type body region in contact with the first gate insulating layer and the second gate insulating layer under the upper n-type region in the narrow portion, connected to the body contact region, and having a p-type impurity concentration lower than a p-type impurity concentration of the body contact region; and a lower n-type region in contact with the first gate insulating layer and the second gate insulating layer under the body region in the narrow portion and in contact with the second electrode.

DETAILED DESCRIPTION

Figure 1:
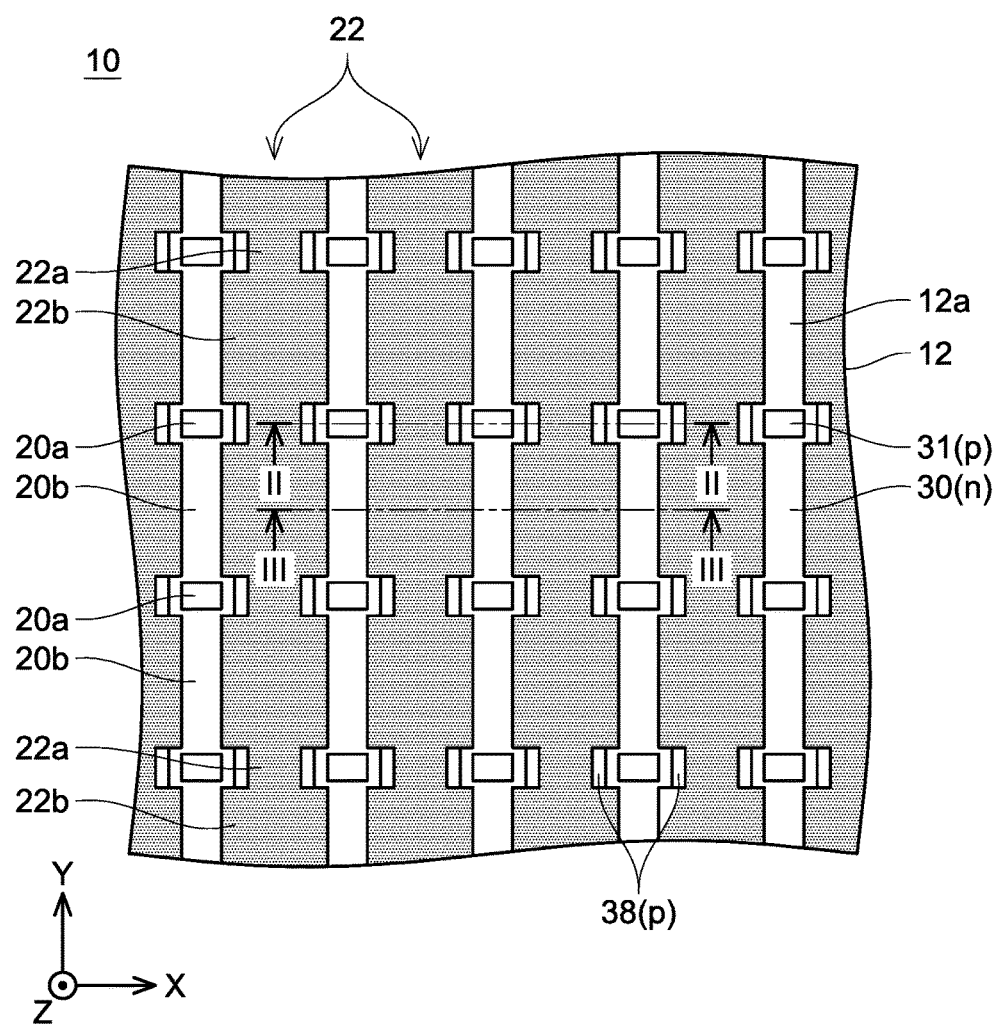
FIG. 1 shows a plan view of a switching element 10.

In one aspect of the present teachings, a switching element disclosed herein may comprise: a semiconductor substrate; a first trench provided in an upper surface of the semiconductor substrate; a second trench provided in the upper surface of the semiconductor substrate and arranged to be apart from the first trench; a first gate insulating layer covering an inner surface of the first trench; a second gate insulating layer covering an inner surface of the second trench; a first gate electrode arranged in the first trench and insulated from the semiconductor substrate by the first gate insulating layer; a second gate electrode arranged in the second trench and insulated from the semiconductor substrate by the second gate insulating layer; an interlayer insulating layer covering an upper surface of the first gate electrode, an upper surface of the second gate electrode and the upper surface of the semiconductor substrate; a first electrode arranged on the interlayer insulating layer and a second electrode, wherein the upper surface of the semiconductor substrate may comprise a wide portion and a narrow portion that are arranged alternately between the first trench and the second trench, the narrow portion being a portion where an interval between the first trench and the second trench is narrower than an interval between the first trench and the second trench in the wide portion, the interlayer insulating layer may comprise a contact hole in the wide portion, the first electrode may be in contact with the semiconductor substrate within the contact hole, and the semiconductor substrate may comprise: an upper n-type region extending from the wide portion to the narrow portion, in contact with the first gate insulating layer and the second gate insulating layer in the narrow portion, and in contact with the first electrode within the contact hole in the wide portion; a p-type body contact region in contact with the first electrode within the contact hole in the wide portion; a p-type body region in contact with the first gate insulating layer and the second gate insulating layer under the upper n-type region in the narrow portion, connected to the body contact region, and having a p-type impurity concentration lower than a p-type impurity concentration of the body contact region; and a lower n-type region in contact with the first gate insulating layer and the second gate insulating layer under the body region in the narrow portion and in contact with the second electrode.

In this switching element, the wide portion and the narrow portion are provided between the first and second trenches. The upper n-type region, the body region, and the lower n-type region are provided in the narrow portion. When potentials of the first and second gate electrodes are increased, channels are generated in the body region within the narrow portion. When this occurs, the upper n-type region and the lower n-type region become connected by the channels, and the switching element thereby turns on. Since the interval between the first and second trenches (i.e., a width of the body region in a lateral direction) is narrow in the narrow portion, an influence of depletion layers spreading from the upper and the lower n-type regions to the body region is small. Thus, even if variations are generated in a channel length among the switching elements during mass production of the switching elements, variations in a gate threshold is less likely to occur among the switching elements. Further, in this switching element, the upper n-type region and the body contact region are provided in the wide portion. The upper n-type region and the body contact region within the wide portion are in contact with the first electrode in the contact hole. Since a width of the wide portion is broad, a size of the contact hole can be made large. Thus, in the wide portion, the first electrode can suitably contact the body contact region and the source region. Further, in this switching element, the wide portion and the narrow portion are arranged alternately. Due to this, the contact hole is provided at a position close to the upper n-type region and the body region within the narrow portion. According to this, problems related to an on-resistance and avalanche resistance can be suppressed.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved switching elements, as well as methods for manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 2:
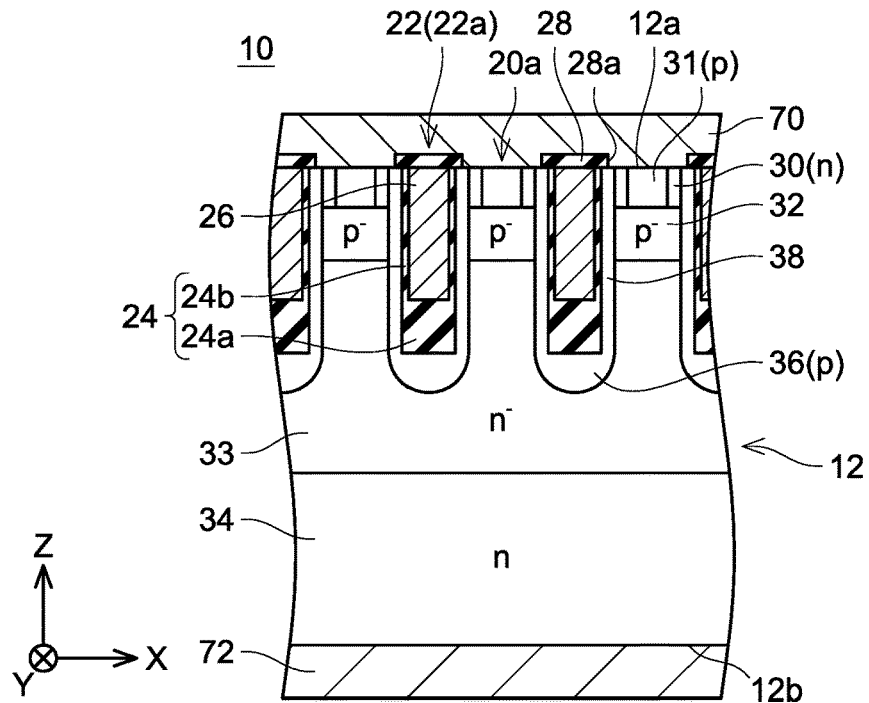
FIG. 2 shows a cross-sectional view along a line II-II of FIG. 1.
Figure 3:
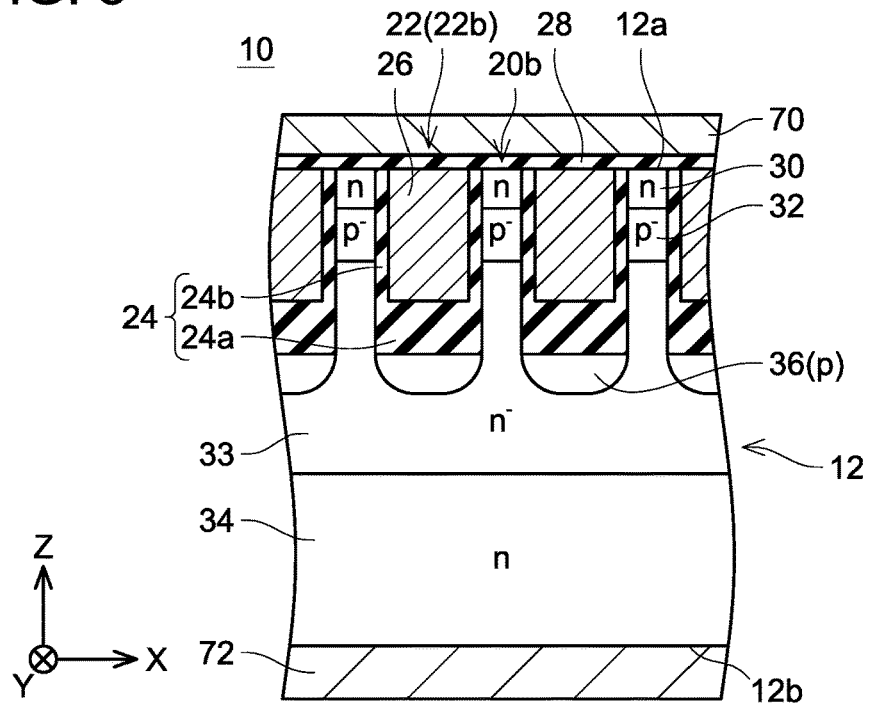
FIG. 3 shows a cross-sectional view along a line III-III of FIG. 1.

A switching element 10 of an embodiment shown in FIGS. 1 to 3 is a MOSFET (Metal-Oxide-Semiconductor Field-Effect Transistor). The switching element 10 includes a semiconductor substrate 12, electrodes, insulating layers, and the like. In FIG. 1, depiction of an electrode and an insulating layer on an upper surface 12a of the semiconductor substrate 12 is omitted for easier view of the drawing. Hereinbelow, one direction parallel to the upper surface 12a of the semiconductor substrate 12 is termed an x direction, and a direction parallel to the upper surface 12a and intersecting perpendicular to the x direction is termed a y direction, and a thickness direction of the semiconductor substrate 12 is termed a z direction. The semiconductor substrate 12 is a SiC substrate which is constituted principally of SiC (silicon carbide).

The upper surface 12a of the semiconductor substrate 12 includes a plurality of trenches 22. As shown in FIG. 1, each of the trenches 22 extends long along the y direction in the upper surface 12a. The plurality of trenches 22 is arranged along the x direction with intervals between each other. Each of the trenches 22 includes narrow-width portions 22a of which width in the x direction is narrow, and wide-width portions 22b of which width in the x direction is wide. In each of the trenches 22, the narrow-width portions 22a and the wide-width portions 22b are arranged alternately along the y direction. As shown in FIG. 2, in each of the narrow-width portions 22a, a width of the trench 22 is narrow from an upper end to a lower end of the trench 22. As shown in FIG. 3, in each of the wide-width portions 22b, the width of the trench 22 is wide from the upper end to the lower end of the trench 22. As shown in FIG. 1, positions of the narrow-width portions 22a along the y direction substantially match among the trenches 22, and positions of the wide-width portions 22b along the y direction also substantially match among the trenches 22. Due to this, an interval between the narrow-width portions 22a of each pair of the trenches 22 is wide, and an interval between the wide-width portions 22b of each pair of the trenches 22 is narrow. Hereinbelow, a semiconductor layer at a portion where the interval between the adjacent trenches 22 is wide (a portion interposed between the narrow-width portions 22a of the adjacent trenches 22) is termed a wide portion 20a. Further, hereinbelow, the semiconductor layer at a portion where the interval between the adjacent trenches 22 is narrow (a portion interposed between the wide-width portions 22b of the adjacent trenches 22) is termed a narrow portion 20b. A plurality of the wide portions 20a and a plurality of the narrow portions 20b are arranged alternately along the y direction (i.e., along a longitudinal direction of the respective trenches 22) between each pair of the trenches 22.

As shown in FIGS. 2 and 3, an inner surface of each of the trenches 22 is covered by a gate insulating layer 24. Each gate insulating layer 24 includes a bottom insulating layer 24a and a lateral insulating layer 24b. Each bottom insulating layer 24a is provided at a bottom of its corresponding trench 22. This bottom insulating layer 24a covers a bottom surface of the corresponding trench 22 and a lateral surface of this trench 22 in a vicinity of the bottom surface. Each lateral insulating layer 24b covers the lateral surface of its corresponding trench 22 above the bottom insulating layer 24a. A thickness of the bottom insulating layers 24a is thicker than a thickness of the lateral insulating layers 24b. Each of the trenches 22 has a gate electrode 26 arranged therein. Each gate electrode 26 is insulated from the semiconductor substrate 12 by its corresponding gate insulating layer 24. The thickness of the lateral insulating layers 24b is substantially constant regardless of their positions. Due to this, a width of the gate electrodes 26 is wider within the wide-width portions 22b of the trenches 22 than within the narrow-width portions 22a of the trenches 22.

As shown in FIGS. 2 and 3, the upper surface 12a of the semiconductor substrate 12 has an interlayer insulating layer 28 arranged thereon. The interlayer insulating layer 28 covers an upper surface of each gate electrode 26. Further, the interlayer insulating layer 28 covers an entirety of the upper surface 12a of the semiconductor substrate 12 within the respective narrow portions 20b. Contact holes 28a are provided in the interlayer insulating layer 28 at positions located on the respective wide portions 20a. No contact hole 28a is provided in the interlayer insulating layer 28 at positions located on the respective narrow portions 20b.

As shown in FIGS. 2 and 3, an upper electrode 70 is arranged on the interlayer insulating layer 28. The upper electrode 70 is insulated from each gate electrode 26 by the interlayer insulating layer 28. The upper electrode 70 is in contact with the upper surface 12a of the semiconductor substrate 12 within the contact holes 28a.

A lower surface 12b of the semiconductor substrate 12 is provided with a lower electrode 72. The lower electrode 72 is in contact with the lower surface 12b of the semiconductor substrate 12.

As shown in FIGS. 1 to 3, a plurality of source regions 30, a plurality of body contact regions 31, a plurality of body regions 32, a drift region 33, a drain region 34, a plurality of bottom p-type regions 36, and a plurality of connecting p-type regions 38 are provided inside the semiconductor substrate 12.

The source region 30, the body contact regions 31, the body region 32, and the connecting p-type regions 38 are provided in each of the semiconductor layers between the trenches 22. A structure of each semiconductor layer between the trenches 22 is identical to each other, so hereinbelow, structures of the source region 30, the body contact regions 31, the body region 32, and the connecting p-type regions 38 will be described for one of the semiconductor layers between a pair of the trenches 22.

As shown in FIG. 1, one pair of the connecting p-type regions 38 is arranged in each wide portion 20a. No connecting p-type region 38 is arranged in the narrow portions 20b. As shown in FIG. 2, the connecting p-type regions 38 extend in the z direction along the lateral surfaces of the trenches 22 located on both sides of the wide portions 20a. Each of the connecting p-type regions 38 extends from the upper end to the lower end of its corresponding trench 22. Each of the connecting p-type regions 38 is in contact with its corresponding lateral insulating layer 24b and bottom insulating layer 24a.

The source region 30 is an n-type region having a high n-type impurity concentration. As shown in FIG. 1, the source region 30 is arranged in a range disposed at the upper surface 12a of the semiconductor substrate 12. The source region 30 is distributed over both the wide portions 20a and the narrow portions 20b in the range disposed at the upper surface 12a. As shown in FIG. 3, within the narrow portions 20b, the source region 30 is in contact with the lateral insulating layers 24b located on both sides of the narrow portions 20b. As shown in FIG. 2, within the wide portions 20a, the source region 30 is in contact with the upper electrode 70 within the contact holes 28a. The source region 30 is in ohmic contact with the upper electrode 70.

The body contact regions 31 are p-type regions having a high p-type impurity concentration. As shown in FIG. 1, the body contact regions 31 are arranged in ranges disposed at the upper surface 12a of the semiconductor substrate 12. Each body contact region 31 is arranged within its corresponding wide portion 20a. In the upper surface 12a, each body contact region 31 is surrounded by the source region 30. As shown in FIG. 2, within wide portions 20a, the body contact regions 31 are in contact with the upper electrode 70 in the contact holes 28a. The body contact regions 31 are in ohmic contact with the upper electrode 70.

The body region 32 is a p-type region having a p-type impurity concentration that is lower than that of the body contact regions 31. As shown in FIGS. 2 and 3, the body region 32 is distributed over both the wide portions 20a and the narrow portions 20b. Within the narrow portions 20b, the body region 32 is arranged under the source region 30. Within the narrow portions 20b, the body region 32 is in contact with the lateral insulating layers 24b located on the both sides of the narrow portions 20b under the source region 30. Within each wide portion 20a, the body region 32 is arranged under the body contact region 31 and the source region 30. Within each wide portion 20a, the body region 32 is in contact with each of the connecting p-type regions 38.

Next, the semiconductor layer under the body regions 32 will be described. As shown in FIGS. 2 and 3, each of the bottom p-type regions 36 is arranged in a range opposed to the bottom surface of its corresponding trench 22. Each bottom p-type region 36 is in contact with the bottom insulating layer 24a at the bottom surface of its corresponding trench 22. Each bottom p-type region 36 extends long in the y direction, along the bottom surface of its corresponding trench 22. Each bottom p-type region 36 is in contact with the bottom insulating layer 24a over an entirety of the bottom surface of its corresponding trench 22. Each bottom p-type region 36 is connected to its corresponding body regions 32 via the connecting p-type regions 38 located above the bottom p-type region 36.

The drift region 33 is an n-type region having a lower n-type impurity concentration than the source regions 30. As shown in FIGS. 2 and 3, the drift region 33 is distributed over both the wide portions 20a and the narrow portions 20b. Further, the drift region 33 is distributed from a region between each pair of the trenches 22 to a region located below the lower ends of the trenches 22. The drift region 33 is arranged under the body regions 32 in both the wide portions 20a and the narrow portions 20b. The drift region 33 is separated from the source regions 30 by the body regions 32. The drift region 33 in each narrow portion 20b is in contact with the lateral insulating layers 24b on the both sides of the narrow portion 20b under the body regions 32. The drift region 33 in each wide portion 20a is in contact with each of the connecting p-type regions 38 under the body regions 32. Further, the drift region 33 is in contact with each of the bottom p-type regions 36.

The drain region 34 is an n-type region having a higher n-type impurity concentration than the drift region 33. As shown in FIGS. 2 and 3, the drain region 34 is arranged under the drift region 33. The drain region 34 is arranged in a range disposed at the lower surface 12b of the semiconductor substrate 12. The drain region 34 is in ohmic contact with the lower electrode 72.

Next, an operation of the switching element 10 will be described. When the switching element 10 is used, the switching element 10, a load (such as a motor), and a power source are connected in series. A power voltage (which is approximately 800V in this embodiment) is applied to a serial circuit of the switching element 10 and the load. The power voltage is applied in a direction by which a drain side (the lower electrode 72) comes to have a higher potential than a source side (the upper electrode 70) in the switching element 10. When a gate-on potential (a potential higher than a gate threshold) is applied to the gate electrodes 26, channels (inverted layers) are generated in the body regions 32 in the narrow portions 20b in ranges that are in contact with the lateral insulating layers 24b, as a result of which the switching element 10 turns on. When a gate-off potential (a potential equal to or lower than the gate threshold) is applied to the gate electrodes 26, the channels disappear, as a result of which the switching element 10 turns off. Hereinbelow, the operation of the switching element 10 will be described in detail.

When the switching element 10 is to be turned off, the potential of the gate electrodes 26 is brought down from the gate-on potential to the gate-off potential. In so doing, the channels disappear, and a potential of the lower electrode 72 rises. In the course of this rise in the potential of the lower electrode 72, potentials of the drain region 34 and the drift region 33 rise. When the potential of the drift region 33 rises, a potential of the bottom p-type regions 36 behaves to rise due to a capacitive coupling between the drift region 33 and the bottom p-type regions 36. However, in the course of the rise in the potential of the drift region 33, holes flow from the bottom p-type regions 36 to the upper electrode 70 in the contact holes 28a through the connecting p-type regions 38, the body regions 32, and the body contact regions 31. Thus, the potential of the bottom p-type regions 36 is maintained at substantially a same potential as a potential of the body regions 32. Accordingly, when the potential of the drift region 33 rises, a reverse voltage is applied to a pn junction at an interface between the drift region 33 and p-type regions constituted of the body regions 32, the connecting p-type regions 38, and the bottom p-type regions 36. Due to this, a depletion layer spreads to the drift region 33 from each of these p-type regions. With such depletion layers spreading from the bottom p-type regions 36 to the drift region 33, a high electric field is suppressed from being applied to the gate insulating layers 24 in vicinities of the lower ends of the gate electrodes 26.

When the switching element 10 is to be turned on, the potential of the gate electrodes 26 is brought up from the gate-off potential to the gate-on potential. In so doing, channels are generated in the body regions 32 in the narrow portions 20b in the ranges that are in contact with the gate insulating layers 24. By these channels, the source regions 30 and the drift region 33 are connected. As a result of this, the potential of the drift region 33 drops. Then, the depletion layer, which was spreading from the body regions 32 to the drift region 33, shrinks. Due to this, electrons flow from the upper electrode 70 in the contact holes 28a to the lower electrode 72 through the source regions 30, the channels, the drift region 33, and the drain region 34. Further, when the potential of the drift region 33 drops, the potential of the bottom p-type regions 36 behaves to drop due to the capacitive coupling between the drift region 33 and the bottom p-type regions 36. However, in the course of the drop in the potential of the drift region 33, holes flow from the upper electrode 70 in the contact holes 28a to the bottom p-type regions 36 through the body contact regions 31, the body regions 32, and the connecting p-type regions 38. Thus, the potential of the bottom p-type regions 36 is maintained at substantially the same potential as the potential of the body regions 32. Thus, when the potential of the drift region 33 drops, a potential difference between the bottom p-type regions 36 and the drift region 33 becomes small, and the depletion layer, which was spreading from the bottom p-type regions 36 to the drift region 33, shrinks. Due to this, a region through which electrons in the drift region 33 can flow is thereby broadened. Thus, resistance of the drift region 33 drops, and the electrons can more easily flow from the upper electrode 70 toward the lower electrode 72. Due to this, a loss generated in the drift region 33 is suppressed.

As described above, in the switching element 10, the bottom p-type regions 36 are connected to the body regions 32 by the connecting p-type regions 38, and thus the depletion layer, which was spreading from the bottom p-type regions 36 to the drift region 33, shrinks within a short period of time after the switching element 10 has turned on. Accordingly, the switching element 10 has a low on-resistance immediately after its turn-on.

Further, in the switching element 10, the wide portions 20a and the narrow portions 20b are arranged alternately between each pair of the trenches 22, and the contact holes 28a are provided at upper portions of the respective wide portions 20a. Due to this, each of current paths from the source regions 30 within the respective narrow portions 20b to the contact holes 28a is short, and thus resistance of each of these current paths is small. Due to this, the on-resistance of the switching element 10 is reduced.

Further, in an off-state of the switching element 10, there may be a case where an electric field is accumulated within the drift region 33 under the body regions 32, and holes are generated due to avalanche effect within the drift region 33. In the switching element 10, each of current paths from the body regions 32 within the respective narrow portions 20b to the contact holes 28a is short, and thus resistance of each of these current paths is small. Due to this, the holes generated in the drift region 33 due to the avalanche effect can easily flow to the contact holes 28a through the body regions 32 and the body contact regions 31. Due to this, the holes generated by the avalanche effect are less likely to remain within the drift region 33, and overcurrent caused by the avalanche effect is less likely to occur in the drift region 33. Thus, the switching element 10 exhibits a high avalanche resistance.

Figure 4:
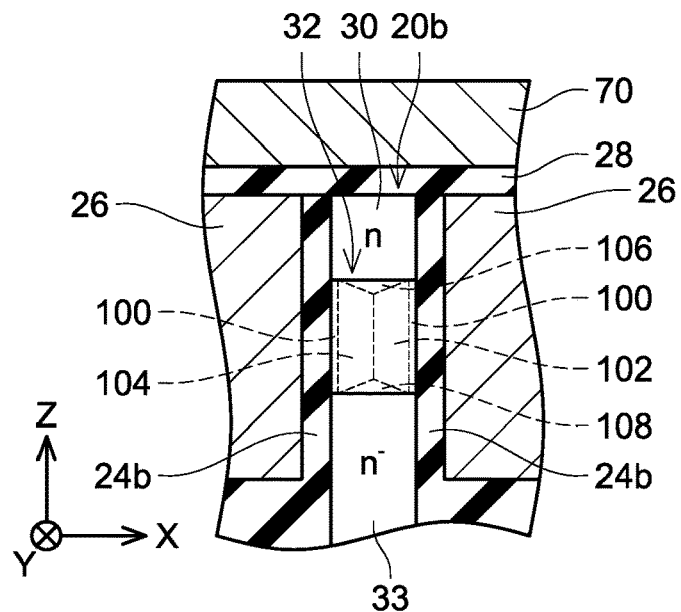
FIG. 4 shows an explanatory diagram showing a distribution of a depletion layer of an embodiment.

Further, in the switching element 10, a width of the body regions 32 along the x direction is narrow in the narrow portions 20b. Due to this, when the switching element 10 is to turn on, entireties of the body regions 32 in the narrow portions 20b are depleted. Due to this, the gate threshold of the switching element 10 is easily stabilized. Hereinbelow, this will be described in detail with reference to FIGS. 4 and 5. FIG. 4 shows a depletion layer distribution in an on-state of the switching element 10 of the embodiment. As shown in FIG. 4, in the on-state, channels 100 are generated in the body region 32 in vicinities of the lateral insulating layers 24b in each narrow portion 20b. Further, depletion layers 102, 104 extending from the lateral insulating layers 24b spread in ranges that are adjacent to the channels 100. Further, a depletion layer 106 spreads from the source region 30 to the body region 32, and a depletion layer 108 spreads from the drift region 33 to the body region 32. The depletion layers 102, 104 extending from the lateral insulating layers 24b on both sides of the body region 32 connect to each other at a center of the body region 32, as a result of which the entirety of the body region 32 is depleted. Due to this, the depletion layers 106, 108 from the source region 30 and the drift region 33 are suppressed from spreading further. Especially, since the electric field applied to the pn junction at the interface between the drift region 33 and the body region 32 is suppressed due to the narrow interval between the trenches 22, the depletion layer 108 is suppressed from spreading from the drift region 33 into the body region 32.

Figure 5:
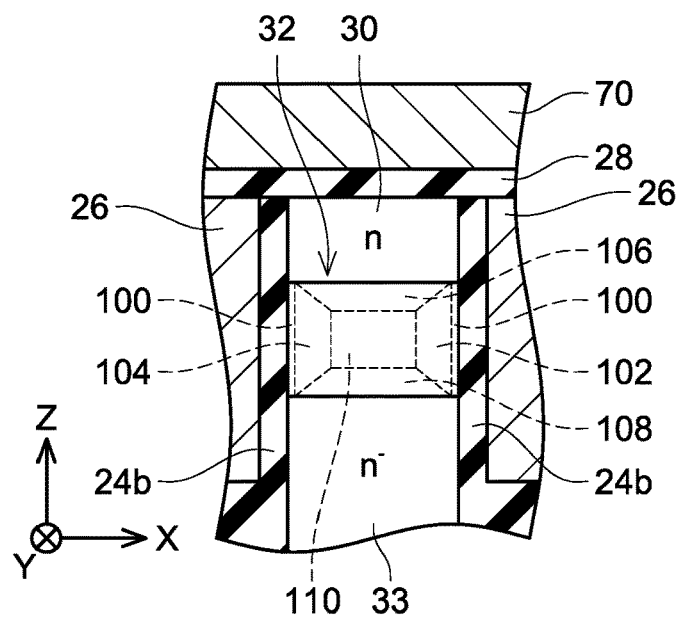
FIG. 5 shows an explanatory diagram showing a distribution of a depletion layer in a comparative example.

Contrary to this, FIG. 5 shows a comparative example in which the interval between the trenches 22 is wide (that is, the width of the body region 32 in the x direction is wide). In FIG. 5, the depletion layers 102, 104 extending from the lateral insulating layers 24b do not connect with each other, and a non-depleted region 110 exists at the center of the body region 32. In this case, the depletion layers 106, 108 spread widely into the body region 32 from the source region 30 and the drift region 33. When widths of the depletion layers 106, 108 spreading from the source region 30 and the drift region 33 to the body region 32 are wide as shown in FIG. 5, electric fields caused by fixed charges (acceptor ions) in these depletion layers 106, 108 severely affect the gate threshold of the switching element 10. That is, when a channel length (a thickness of the body region 32 in the range being in contact with the lateral insulating layers 24b (that is, a distance between the source region 30 and the drift region 33)) is short, ranges of the depletion layers 106, 108 become relatively large with respect to ranges of the depletion layers 102, 104, resulting in a decreased gate threshold. On the other hand, when the channel length is long, the ranges of the depletion layers 106, 108 become relatively small with respect to the ranges of the depletion layers 102, 104, resulting in an increased gate threshold. Due to this, with the configuration of FIG. 5, the gate threshold exhibits variations if the channel length varies. Especially, with SiC substrates, such a short channel effect becomes prominent when the channel length is equal to or less than 1 µm, and the variations in the gate threshold become large.

Contrary to this, in the configuration of the present embodiment shown in FIG. 4, the influence of the depletion layers 106, 108 from the source region 30 and the drift region 33 is suppressed by the entirety of the body region 32 being depleted. Due to this, the gate threshold exhibits less variations even if the channel length varies. Especially, the variations in the gate threshold can be suppressed even if the channel length is equal to or less than 1 µm. Further, by setting the channel length to be equal to or less than 1 µm, an on-resistance of the switching element 10 can effectively be reduced.

Next, a manufacturing method of the switching element 10 of the embodiment will be described. The switching element 10 is manufactured from an n-type semiconductor substrate 12 (the semiconductor substrate 12 before processing) having an n-type impurity concentration at about a same degree as that of the drain region 34. FIGS. 6 to 17 show cross-sectional views of the switching element 10 in a manufacturing process. In each of FIGS. 6 to 17, a cross section on the left side shows a cross section in a range corresponding to FIG. 2, and a cross section on the right side shows a cross section in a range corresponding to FIG. 3. Hereinbelow, the range corresponding to FIG. 2 (a range where the wide portions 20a are to be formed) will be termed a first range 111, and the range corresponding to FIG. 3 (a range where the narrow portions 20b are to be formed) will be termed a second range 112.

Figure 6:
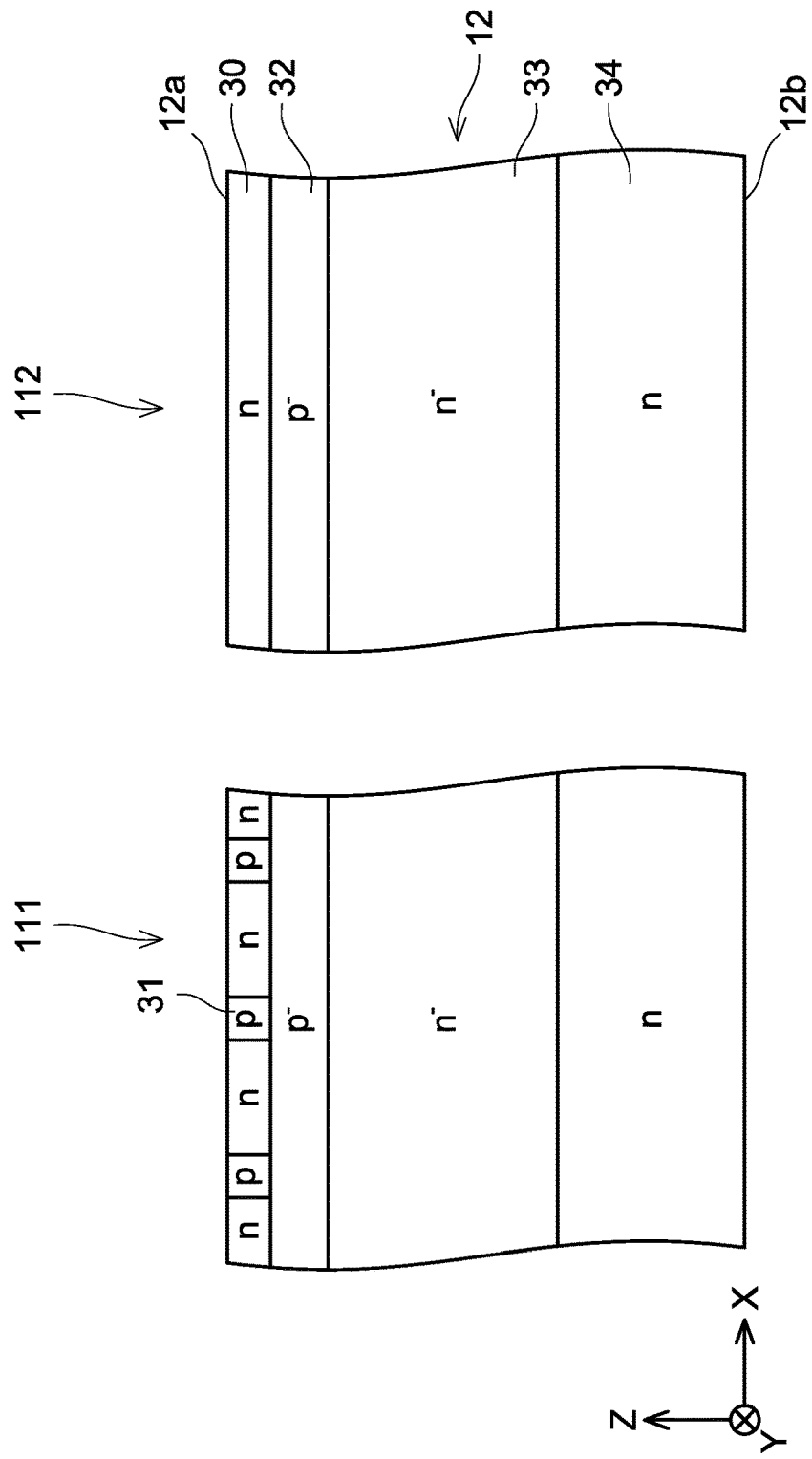
FIG. 6 shows an explanatory diagram of a manufacturing method of the embodiment.
Figure 7:
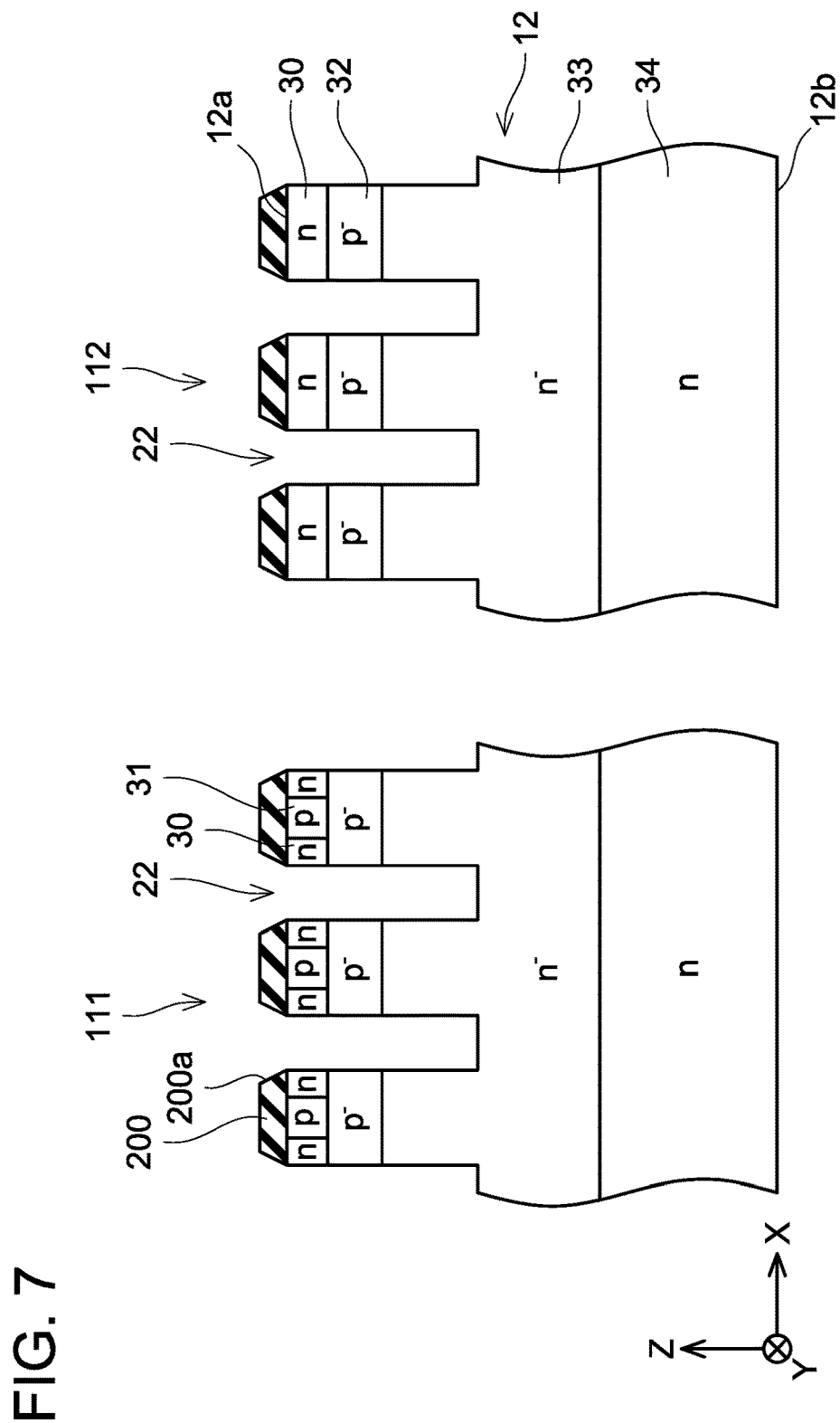
FIG. 7 shows an explanatory diagram of the manufacturing method of the embodiment.

Firstly, as shown in FIG. 6, the drift region 33, the body region 32, the source region 30, and the body contact regions 31 are formed on the drain region 34 by epitaxial growth, ion implantation, and the like. The body contact regions 31 are formed only in the first range 111. Next, as shown in FIG. 7, a mask 200 having openings 200a is formed on the upper surface 12a of the semiconductor substrate 12 to etch the upper surface 12a within the openings 200a. Due to this, the trenches 22 are formed. At this stage, the width of the trenches 22 is substantially same in the first range 111 and the second range 112.

Figure 8:
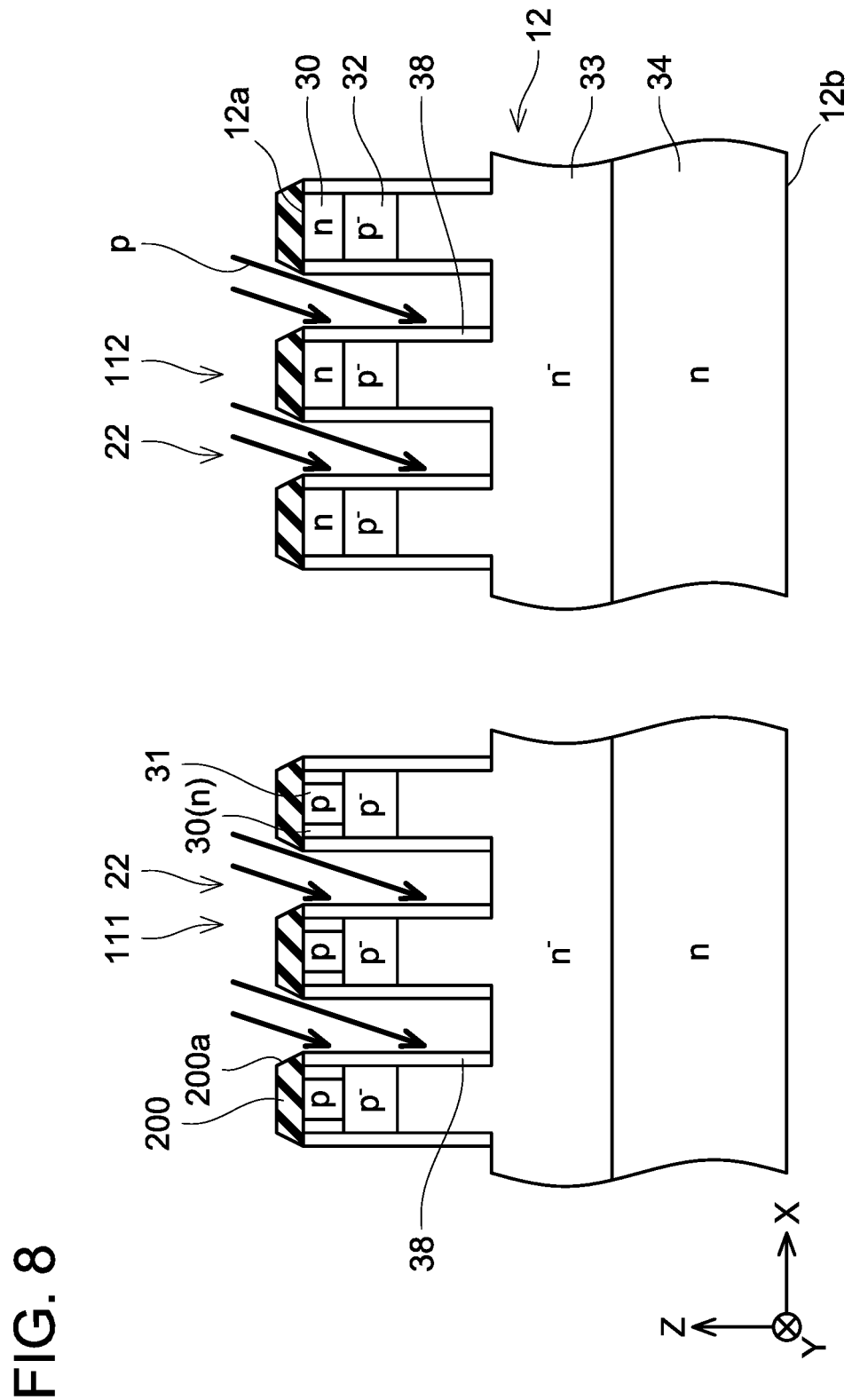
FIG. 8 shows an explanatory diagram of the manufacturing method of the embodiment.

Next, as shown in FIG. 8, p-type impurities are implanted to the lateral surfaces of the trenches 22 along a direction that is tilted with respect to the upper surface 12a. Due to this, the connecting p-type regions 38 are formed. Here, the p-type impurities are implanted while the semiconductor substrate 12 is heated at between 200 to 500° C. Further, the connecting p-type regions 38 are formed on the lateral surfaces on both sides of each trench 22 by changing the direction of implanting the p-type impurities. At this stage, the connecting p-type regions 38 are formed in both the first range 111 and the second range 112.

Figure 9:
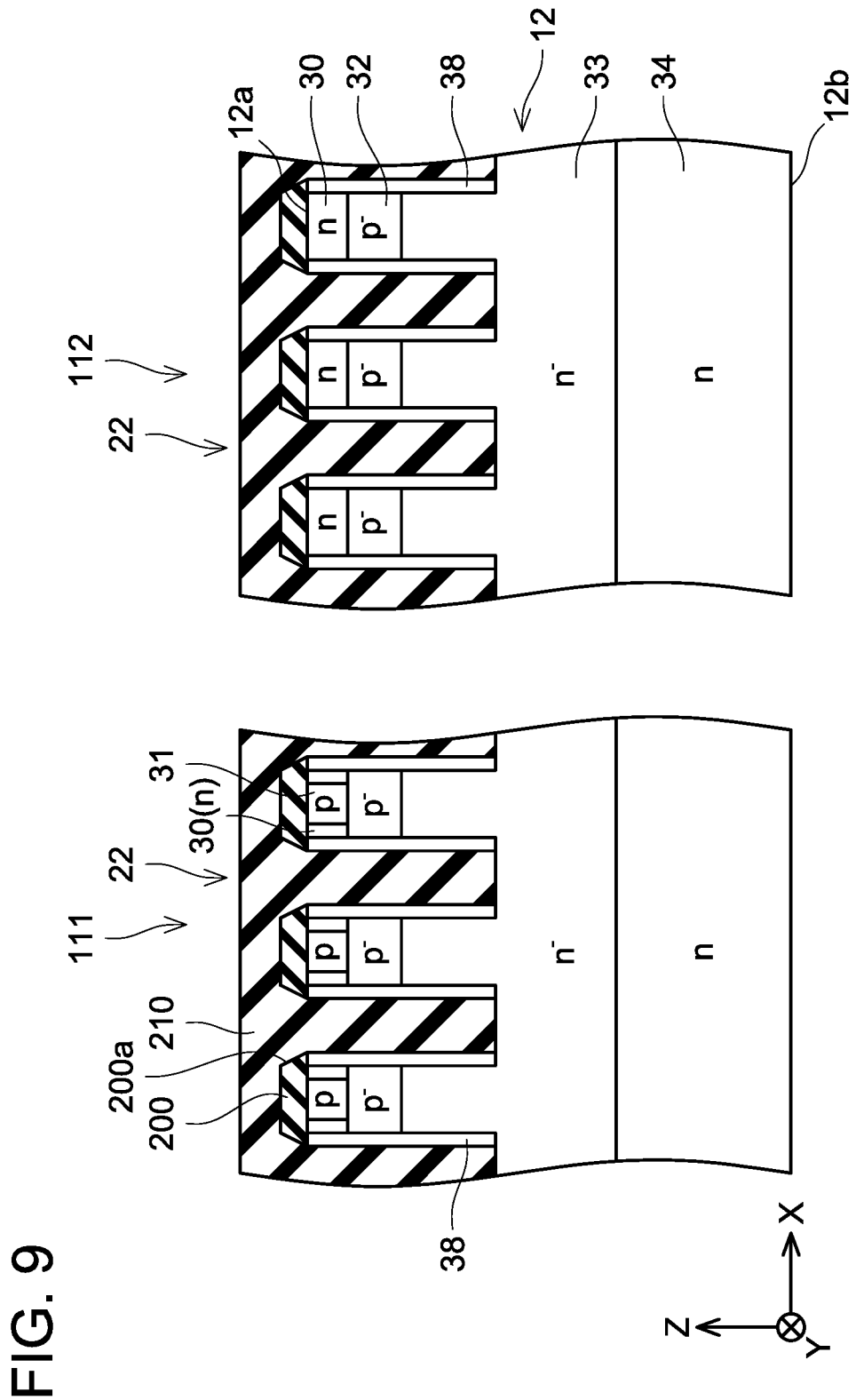
FIG. 9 shows an explanatory diagram of the manufacturing method of the embodiment.
Figure 10:
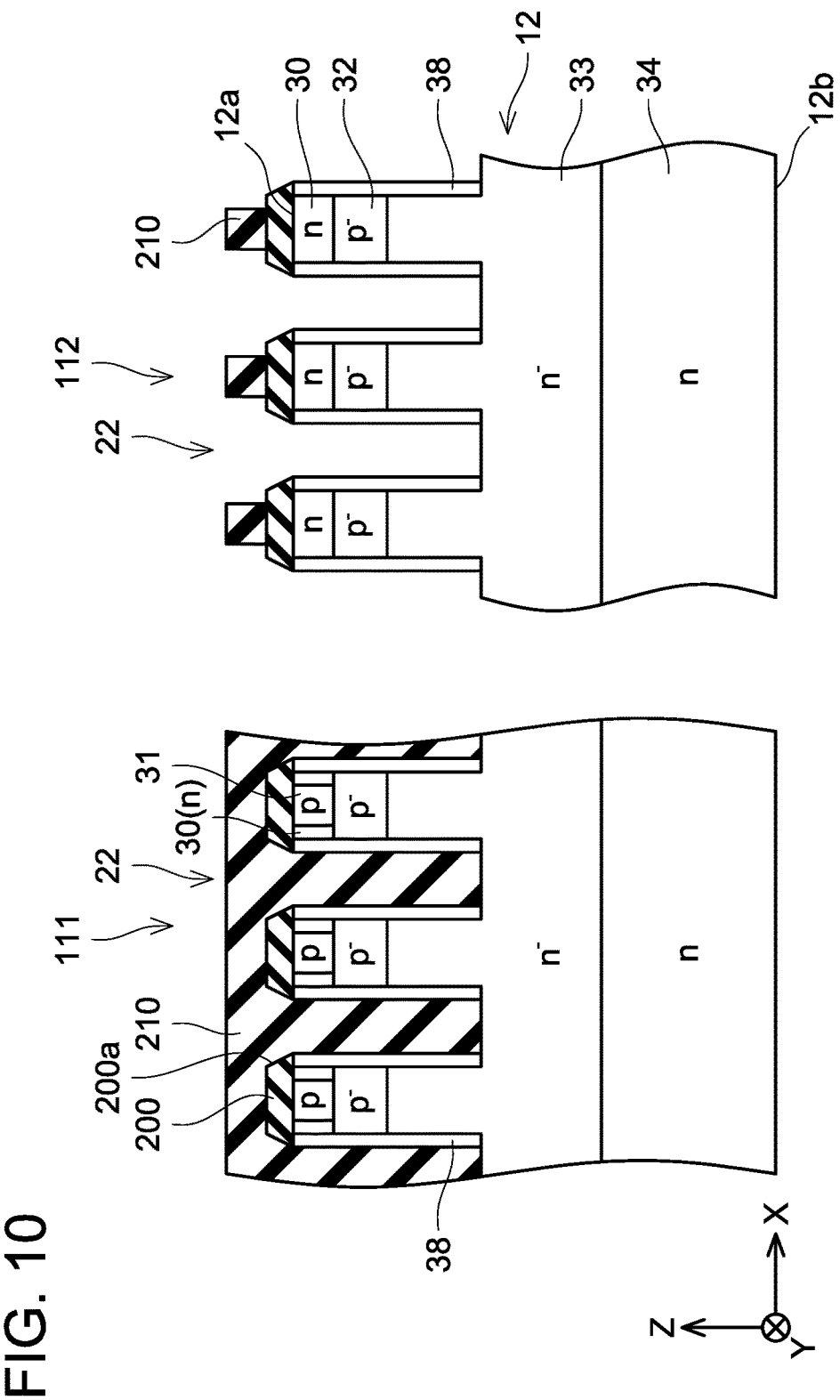
FIG. 10 shows an explanatory diagram of the manufacturing method of the embodiment.

Next, as shown in FIG. 9, a mask 210 covering a surface of the mask 200 and insides of the trenches 22 is formed. Next, as shown in FIG. 10, the mask 210 inside the trenches 22 in the second range 112 is removed by etching. An entirety of the first range 111 is maintained in the state of being covered by the mask 210. Further, an upper surface of the mask 200 in the second range 112 is also maintained in the state of being covered by the mask 210.

Figure 11:
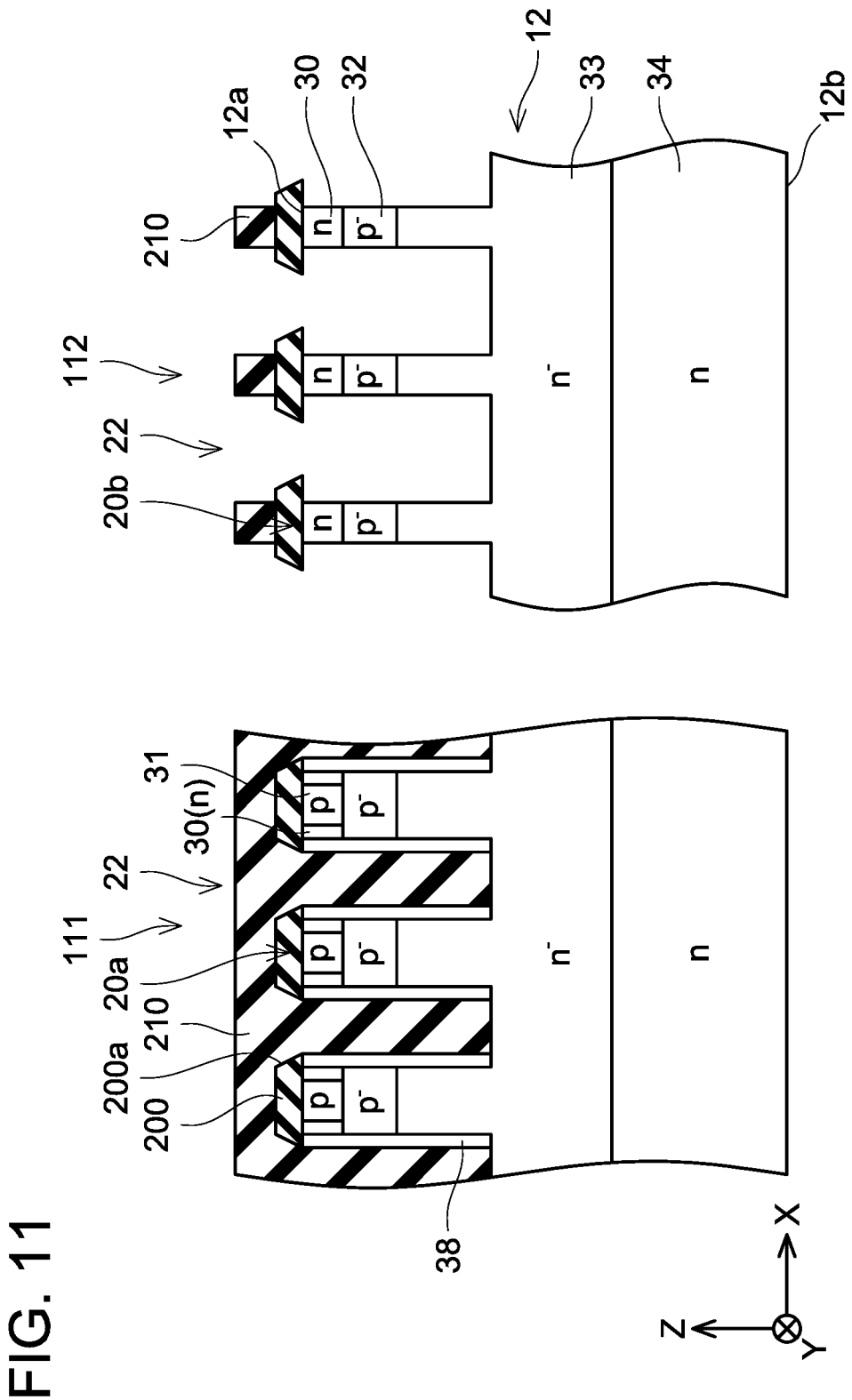
FIG. 11 shows an explanatory diagram of the manufacturing method of the embodiment.

Next, as shown in FIG. 11, the inner surfaces of the trenches 22 in the second range 112 are etched by isotropic etching. Due to this, the connecting p-type regions 38 in the second range 112 are removed. Further, as a result of this, the width of the trenches 22 in the second range 112 is enlarged. As a result, the narrow portions 20b at each of which the interval between the trenches 22 is narrow are formed in the second range 112. Since the semiconductor substrate 12 in the first range 111 is covered by the mask 210, it is not etched at this stage. Due to this, the intervals between the trenches 22 are wider in the first range 111 than in the second range 112. That is, a region between each pair of the trenches 22 in the first range 111 becomes the wide portion 20a. As a result, as shown in FIG. 1, the structure in which the wide portions 20a and the narrow portions 20b are arranged alternately along the y direction between each pair of trenches 22 is formed.

Figure 12:
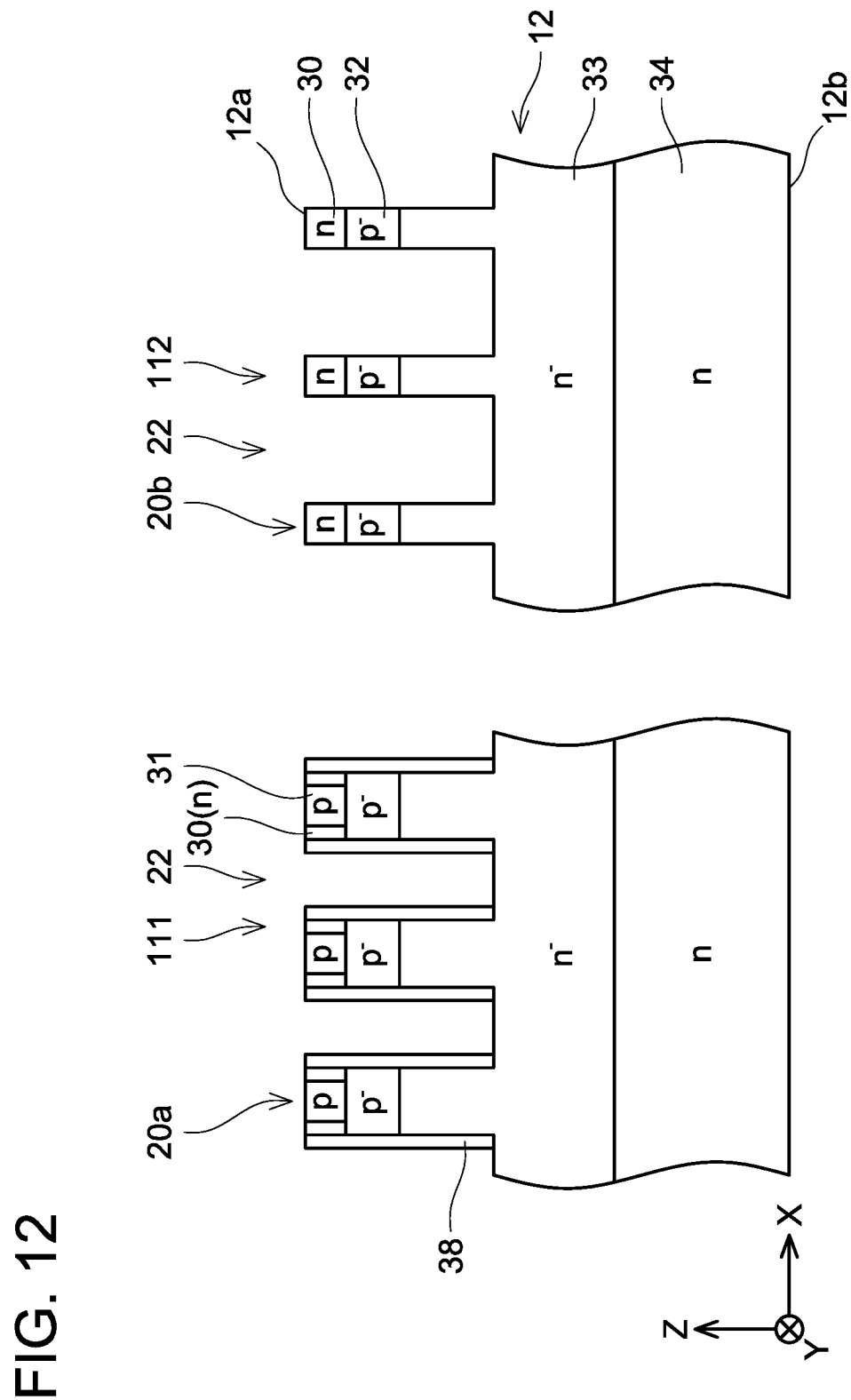
FIG. 12 shows an explanatory diagram of the manufacturing method of the embodiment.
Figure 13:
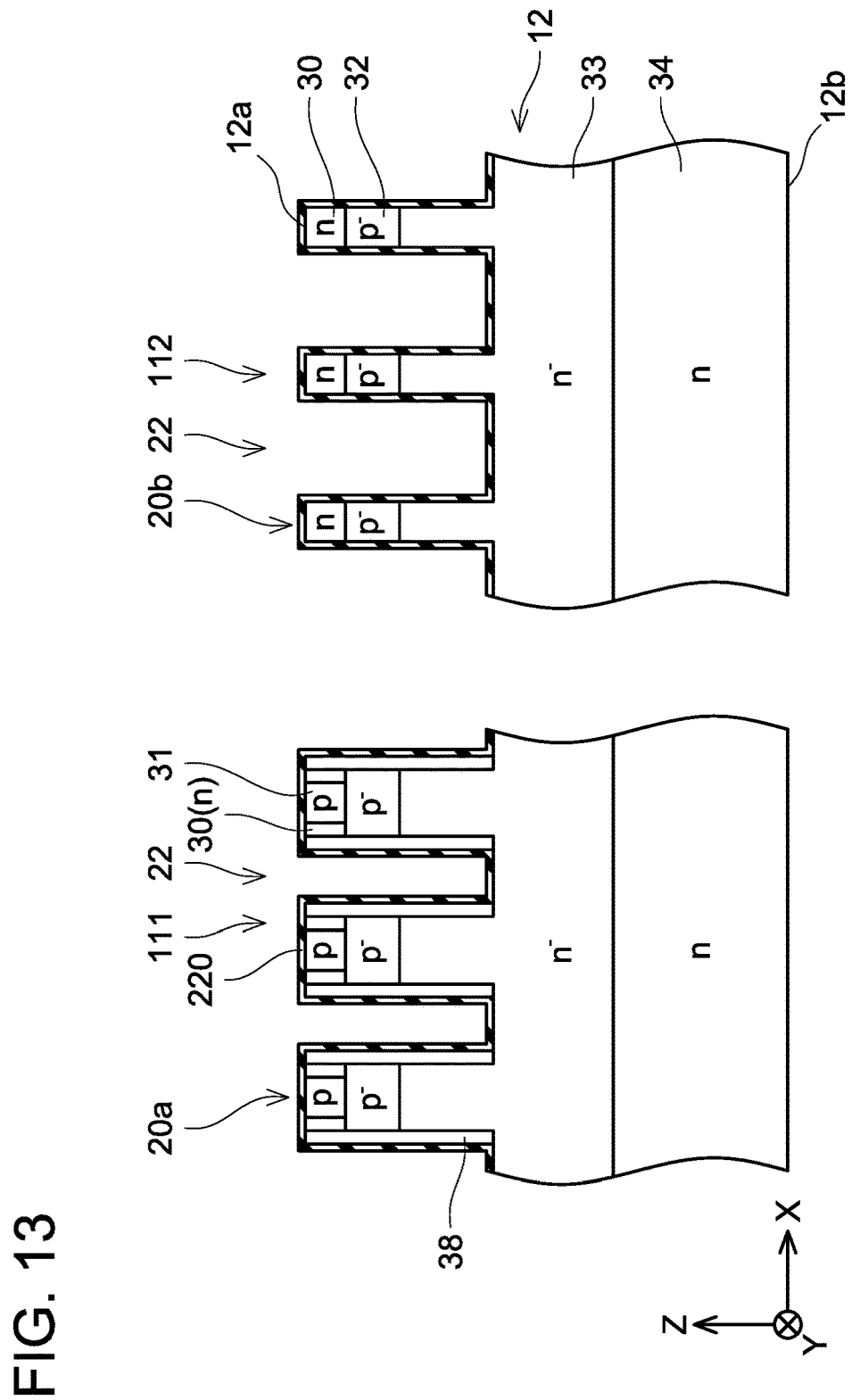
FIG. 13 shows an explanatory diagram of the manufacturing method of the embodiment.
Figure 14:
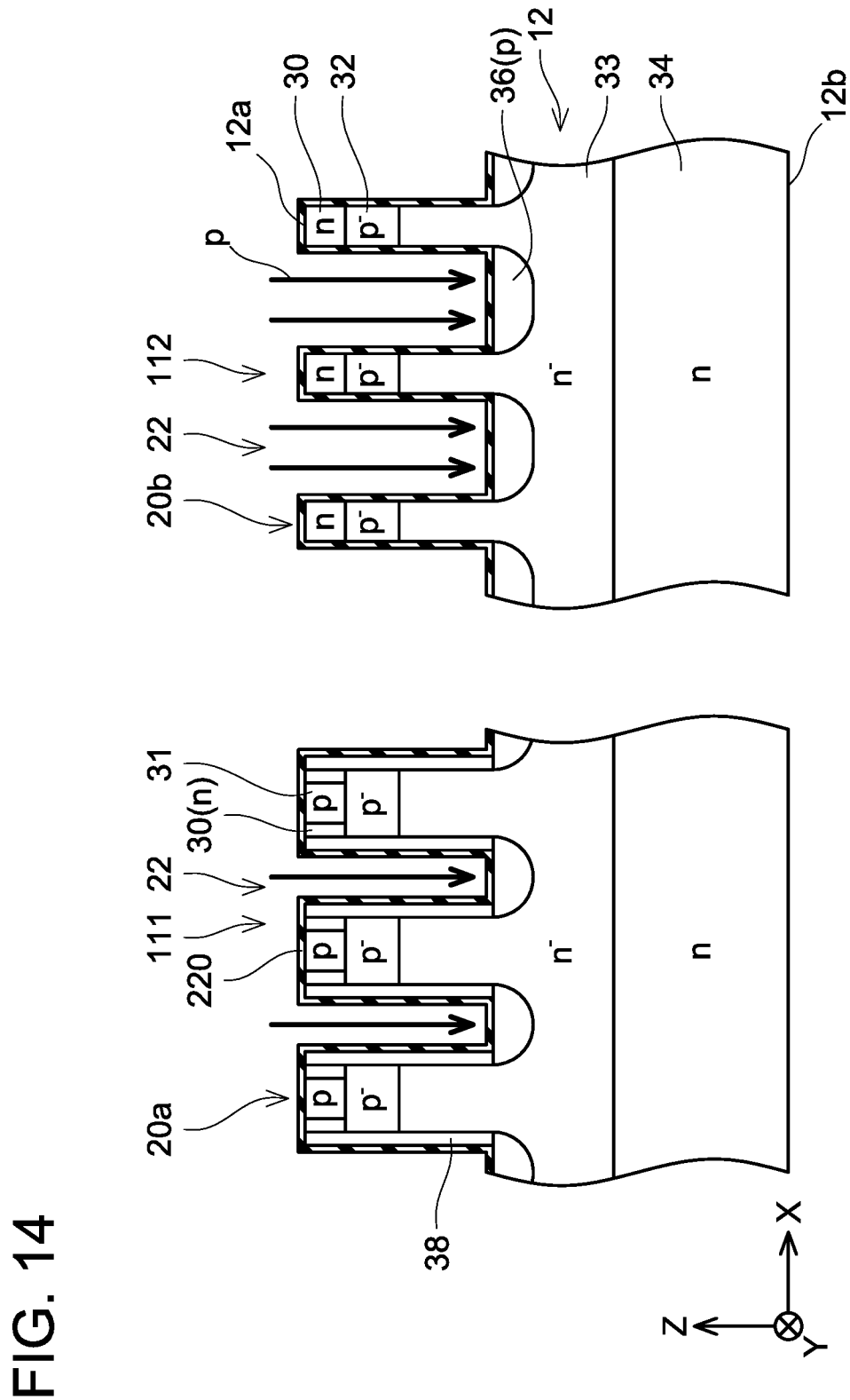
FIG. 14 shows an explanatory diagram of the manufacturing method of the embodiment.
Figure 15:
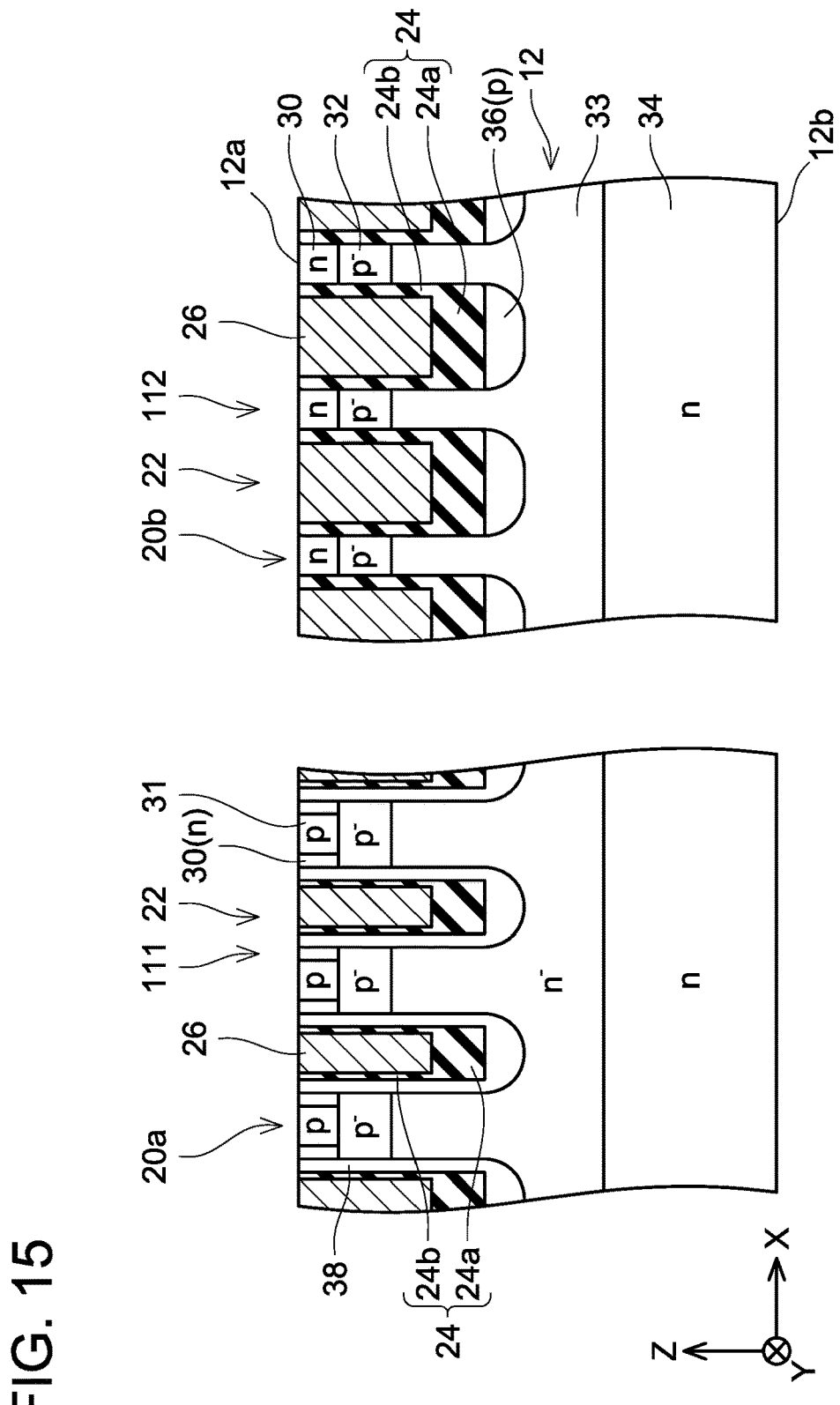
FIG. 15 shows an explanatory diagram of the manufacturing method of the embodiment.

Next, as shown in FIG. 12, the mask 210 and the mask 200 are removed by etching. Then, as shown in FIG. 13, a protective oxide film 220 is grown on the upper surface 12a of the semiconductor substrate 12 and the inner surfaces of the trenches 22. Then, as shown in FIG. 14, the bottom p-type regions 36 are formed by implanting p-type impurities into the bottom surfaces of the respective trenches 22. Then, as shown in FIG. 15, the protective oxide film 220 is removed, and the gate insulating layers 24 and the gate electrodes 26 are formed in the trenches 22.

Figure 16:
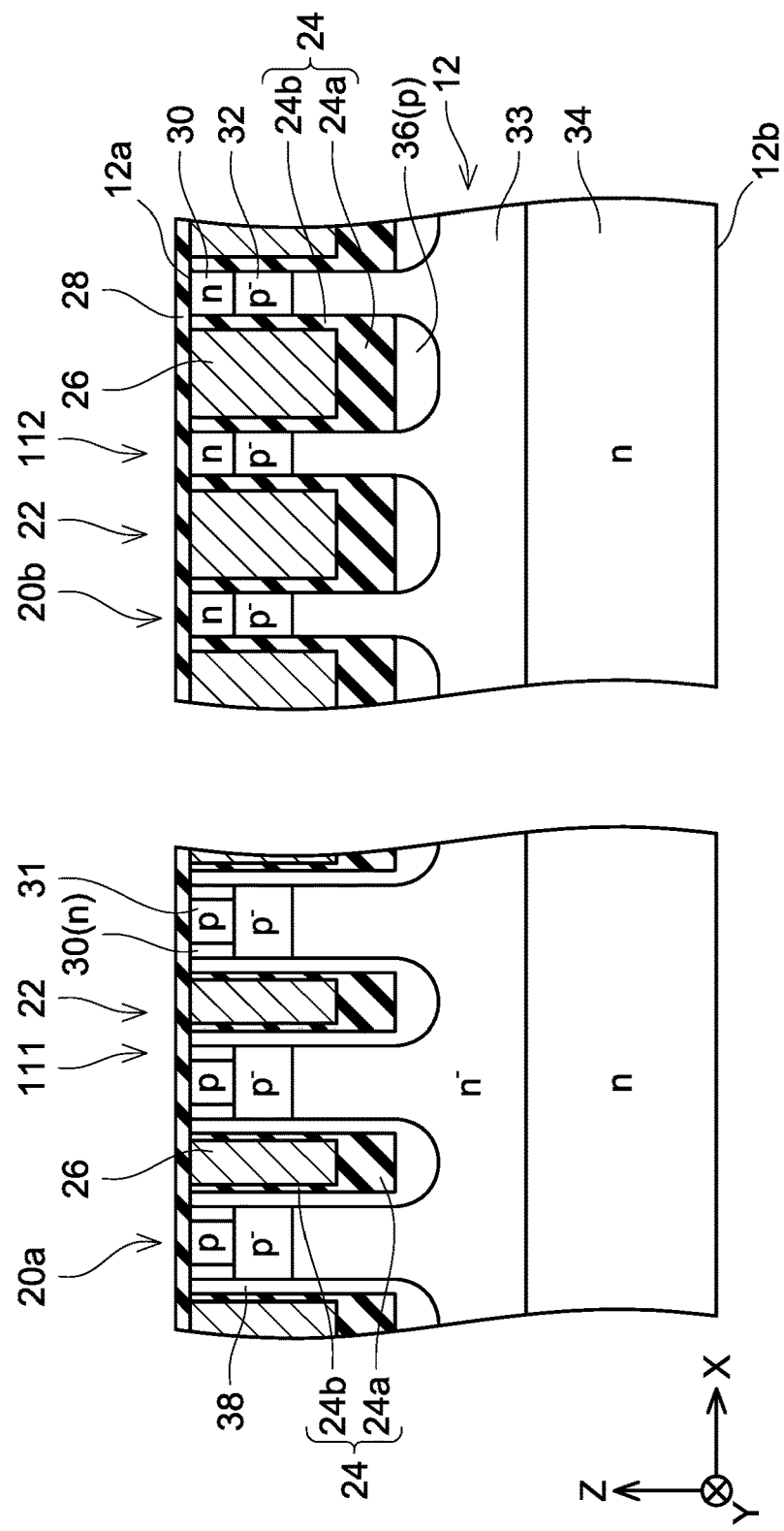
FIG. 16 shows an explanatory diagram of the manufacturing method of the embodiment.
Figure 17:
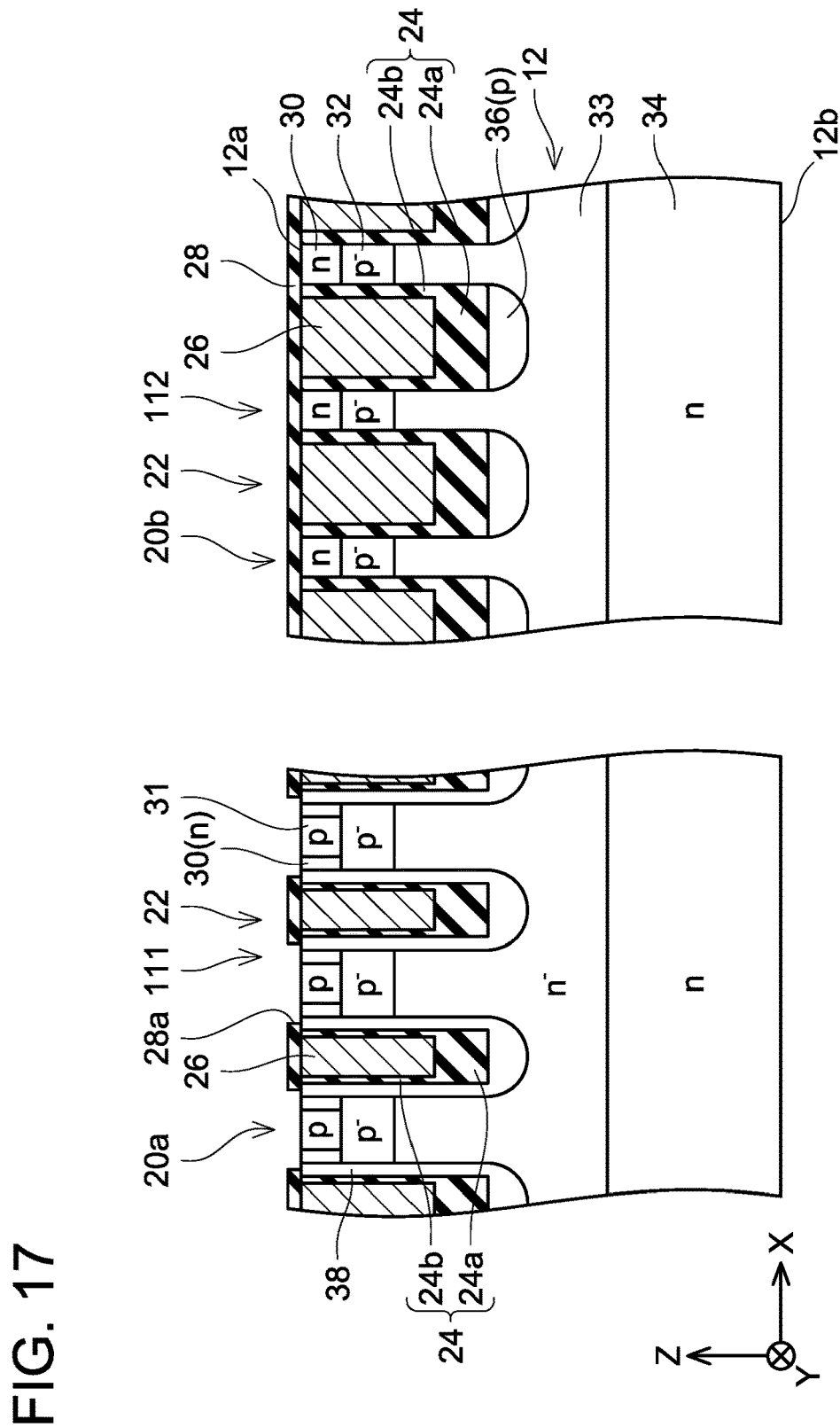
FIG. 17 shows an explanatory diagram of the manufacturing method of the embodiment.

Next, as shown in FIG. 16, the interlayer insulating layer 28 is formed on the upper surface 12a of the semiconductor substrate 12. The interlayer insulating layer 28 is formed to cover an entirety of the upper surface 12a and entireties of the upper surfaces of the gate electrodes 26. Next, as shown in FIG. 17, parts of the interlayer insulating layer 28 are etched to form the contact holes 28a. Here, the contact holes 28a are formed in the interlayer insulating layer 28 covering the wide portions 20a. Since the width of the wide portions 20a is wide, the contact holes 28a with a relatively large size can be formed at the wide portions 20a. Thus, the contact holes 28a can be formed with high profile accuracy. Further, since the width of the wide portions 20a is wide, a clearance between each pair of the contact hole 28a and the gate electrode 26 can be set relatively wide. Thus, even if positional misalignment occurs with the contact holes 28a, the contact holes 28a can be prevented from being arranged on the gate electrodes 26. As above, the wide width of the wide portions 20a allows the contact holes 28a to be formed suitably.

After this, the upper electrode 70 is formed so as to be in contact with the body contact regions 31 and the source regions 30 within the contact holes 28a. Next, the lower electrode 72 is formed on the lower surface 12b of the semiconductor substrate 12. According to the above processes, the switching element 10 shown in FIGS. 1 to 3 is completed.

As described above, since the manufacturing method of this embodiment forms the contact holes 28a in the wide portions 20a, the contact holes 28a can stably be formed.

Further, in this manufacturing method, the connecting p-type regions 38 are formed by implanting the p-type impurities over the entireties of the lateral surfaces of the trenches 22, after which the connecting p-type regions 38 are partially etched to form the structure in which the connecting p-type regions 38 exist only at parts of the lateral surfaces of the trenches 22. As another method, this structure may be obtained by implanting the p-type impurities to the parts of the lateral surfaces of the trenches 22, however, a mask for partially covering the lateral surfaces of the trenches 22 becomes necessary in this case. A mask patterned as such to partially cover the lateral surfaces of the trenches 22 is generally constituted of resist resin. When resist resin is used as a mask, the ion implantation cannot be carried out while the semiconductor substrate 12 is heated. Thus, in this case, crystal defects are generated at a high density within the connecting p-type regions. The crystal defects generated as above are difficult to recover in a SiC substrate. Contrary to this, the above embodiment does not use any resist resin mask for implanting the p-type impurities to the lateral surfaces of the trenches 22, and thus the ion implantation can be performed while the semiconductor substrate 12 is heated. Thus, the connecting p-type regions 38 having a low crystal defect density can be formed. Due to this, according to this method, the switching element 10 with small amount of leakage current can be manufactured.

Further, in this manufacturing method, the width of the trenches 22 is widened by etching the lateral surfaces of the trenches 22, and the widened portions become channel regions (regions where the channels are generated). When the lateral surfaces of the trenches 22 are etched, surface roughness of the lateral surfaces is reduced at the etched portions. Due to this, when the channels are generated, electron mobility in the channels increases. Due to this, according to this method, the switching element 10 with even lower on-resistance can be manufactured.

In the aforementioned embodiment, the MOSFET has been described, however, the technique disclosed herein may be applied to an IGBT (Insulated Gate Bipolar Transistor). For example, in the aforementioned switching element 10, an IGBT can be obtained by providing a p-type collector region at a portion in contact with the lower electrode 72.

Further, in the aforementioned embodiment, the width of the narrow portions 20b is set such that the entireties of the body regions 32 in the narrow portions 20b are depleted when the channels are generated. However, a non-depleted region may remain at a portion of the body region 32 in each of the narrow portions 20b when the channels are generated. Even with such a configuration, the variations in the gate threshold can be suppressed due to the width of the narrow portions 20b being narrow. However, the variations in the gate threshold can be suppressed more effectively if the entireties of the body regions 32 in the narrow portions 20b are depleted upon the generation of the channels.

Further, in the aforementioned embodiment, the wide portions 20a and the narrow portions 20b are provided by providing changes in the width of each trench 22. However, the wide portions 20a and the narrow portions 20b may be provided by giving a bent profile to each trench 22.

Further, in the aforementioned embodiment, the body regions 32 extend from the narrow portions 20b to the wide portions 20a, and the body regions 32 are connected to the body contact regions 31 in the wide portions 20a. However, the body regions 32 may be connected to the body contact regions 31 in a different configuration. For example, the body contact regions 31 may extend from the wide portions 20a to the narrow portions 20b, and the body regions 32 may be connected to the body contact regions 31 in the narrow portions 20b. In this case, the body regions 32 may not extend to the wide portions 20b.

Relationships of the constituent features of the aforementioned embodiment and the constituent features of the claims will be described. One of a pair of trenches interposing the body region 32 therebetween in the embodiment is an example of a first trench in the claims. Further, the gate insulating layer, the gate electrode, the bottom p-type region, and the connecting p-type region provided within and around that trench are examples of a first gate insulating layer, a first gate electrode, a first bottom p-type region, and a first connecting p-type region, respectively. The other of the pair of trenches interposing the body region 32 therebetween in the embodiment is an example of a second trench in the claims. Further, the gate insulating layer, the gate electrode, the bottom p-type region, and the connecting p-type region provided within and around this trench are examples of a second gate insulating layer, a second gate electrode, a second bottom p-type region, and a second connecting p-type region, respectively. The upper electrode in the embodiment is an example of a first electrode in the claims. The lower electrode in the embodiment is an example of a second electrode in the claims. The source regions in the embodiment are examples of an upper n-type region in the claims. The drift region and the drain region in the embodiment are examples of a lower n-type region in the claims.

Some of the features characteristic to the above-described embodiment will herein be listed. It should be noted that the respective technical elements are independent of one another, and are useful.

In one aspect of the present teachings, the body region and the lower n-type region may extend from the wide portion to the narrow portion, and the semiconductor substrate may further comprise: a first bottom p-type region in contact with the first gate insulating layer at a bottom surface of the first trench; a second bottom p-type region in contact with the second gate insulating layer at a bottom surface of the second trench; a first connecting p-type region extending along a lateral surface of the first trench in the wide portion and connecting between the body region and the first bottom p-type region; and a second connecting p-type region extending along a lateral surface of the second trench in the wide portion and connecting between the body region and the second bottom p-type region.

According to this structure, when the switching element turns off, the electric field applied to each of the gate insulating layers at the bottoms of the respective trenches is alleviated by the depletion layers spreading from the respective bottom p-type regions to the lower n-type region. Further, when the switching element turns on, charges are supplied to the respective bottom p-type regions through the corresponding connecting p-type regions, and thus the depletion layers that had been spreading from the respective bottom p-type regions to the lower n-type region shrink within a short period of time. Thus, the current path in the lower n-type region is broad, which reduces the on-resistance of the switching element.

In one aspect of the present teachings, the semiconductor substrate may be a SiC substrate, and a thickness of the body region between the upper n-type region and the lower n-type region may be equal to or less than 1 micrometer in a range where the body region is in contact with the first gate insulating layer and in a range where the body region is in contact with the second gate insulating layer.

The thickness of the body region corresponds to a channel length. In general, with SiC substrates, the short channel effect becomes prominent when the channel length is equal to or less than 1 μm, and the variations in the gate threshold become extremely large. However, with the structure disclosed herein, the variations in the gate threshold can be suppressed even if the channel length is set to be equal to or less than 1 μm. Further, by making the channel length short as described above, the on-resistance of the switching element can be reduced.

Moreover, a method of manufacturing a switching element is disclosed herein. The method disclosed herein may comprise: forming a first trench and a second trench in an upper surface of a semiconductor substrate, the second trench being arranged to be apart from the first trench; and enlarging widths of the first trench and the second trench in an etching region by setting the etching region such that the etching region and a non-etching region are arranged alternately along a longitudinal direction of the first trench and the second trench and by etching a lateral surface of the first trench and a lateral surface of the second trench in the etching region, wherein a narrow portion is formed between the first trench and the second trench in the etching region, the narrow portion is a portion where an interval between the first trench and the second trench is narrower than an interval between the first trench and the second trench in a wide portion positioned between the first trench and the second trench in the non-etching region, wherein the switching element to be manufactured may comprise: a first gate insulating layer covering an inner surface of the first trench; a second gate insulating layer covering an inner surface of the second trench; a first gate electrode arranged in the first trench and insulated from the semiconductor substrate by the first gate insulating layer, a second gate electrode arranged in the second trench and insulated from the semiconductor substrate by the second gate insulating layer an interlayer insulating layer covering an upper surface of the first gate electrode, an upper surface of the second gate electrode, and the upper surface of the semiconductor substrate, and including a contact hole in the wide portion; a first electrode arranged on the interlayer insulating layer and in contact with the semiconductor substrate within the contact hole; and a second electrode, wherein the semiconductor substrate of the switching element to be manufactured may include: an upper n-type region extending from the wide portion to the narrow portion, in contact with the first gate insulating layer and the second gate insulating layer in the narrow portion, and in contact with the first electrode within the contact hole in the wide portion; a p-type body contact region in contact with the first electrode within the contact hole in the wide portion; a p-type body region in contact with the first gate insulating layer and the second gate insulating layer under the upper n-type region in the narrow portion, connected to the body contact region, and having a p-type impurity concentration lower than a p-type impurity concentration of the body contact region; and a lower n-type region in contact with the first gate insulating layer and the second gate insulating layer under the body region in the narrow portion and in contact with the second electrode.

According to this manufacturing method, the variations in the gate threshold among the switching elements to be manufactured can be suppressed, and the contact hole can be formed suitably in the wide portion.

One aspect of the present teachings may comprise: forming a first connecting p-type region extending along the lateral surface of the first trench and a second connecting p-type region extending along the lateral surface of the second trench by implanting p-type impurities to the lateral surface of the first trench and the lateral surface of the second trench before the enlarging of the widths of the first trench and the second trench in the etching region; and forming a first bottom p-type region located at a bottom surface of the first trench and a second bottom p-type region located at a bottom surface of the second trench by implanting p-type impurities to the bottom surface of the first trench and the bottom surface of the second trench, wherein the enlarging of the widths of the first trench and the second trench in the etching region may comprise removing the first connecting p-type region and the second connecting p-type region in the etching region by etching, and wherein in the switching element to be manufactured, the body region and the lower n-type region may extend from the wide portion to the narrow portion, the first connecting p-type region may connect between the body region and the first bottom p-type region in the wide portion, and the second connecting p-type region may connect between the body region and the second bottom p-type region in the wide portion.

In this manufacturing method, the respective connecting p-type regions formed by implanting the p-type impurities to the lateral surfaces of the respective trenches are removed in the etching region such that they remain within a non-etched region. As above, the connecting p-type regions can be provided only partially on the lateral surfaces of the respective trenches. In this method, a mask for covering the lateral surfaces of the trenches is not necessary upon implanting the p-type impurities to the lateral surfaces of the trenches, and thus the impurity implantation can be performed under a high temperature without being limited by heat durability of the mask. Due to this, crystal defects are generated less in the respective connecting p-type regions. Thus, leakage current is suppressed from flowing through the connecting regions. Further, in the etching region, the process for enlarging the width of the trenches and the process of removing the connecting p-type regions can be performed simultaneously, and as such, the switching element can be manufactured efficiently.

In one aspect of the present teachings, the semiconductor substrate may be a SiC substrate, and in the switching element to be manufactured, a thickness of the body region between the upper n-type region and the lower n-type region may be equal to or less than 1 micrometer in a range where the body region is in contact with the first gate insulating layer and in a range where the body region is in contact with the second gate insulating layer.

According to this manufacturing method, the variations in the gate threshold caused by the short channel effect can be suppressed while the on-resistance of the switching element is reduced.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:
1. A switching element comprising:
 a semiconductor substrate;
 a first trench provided in an upper surface of the semiconductor substrate;
 a second trench provided in the upper surface of the semiconductor substrate and arranged to be apart from the first trench;
 a first gate insulating layer covering an inner surface of the first trench;
 a second gate insulating layer covering an inner surface of the second trench;
 a first gate electrode arranged in the first trench and insulated from the semiconductor substrate by the first gate insulating layer,
 a second gate electrode arranged in the second trench and insulated from the semiconductor substrate by the second gate insulating layer;
 an interlayer insulating layer covering an upper surface of the first gate electrode, an upper surface of the second gate electrode and the upper surface of the semiconductor substrate;
 a first electrode arranged on the interlayer insulating layer, and
 a second electrode,
 wherein
 the upper surface of the semiconductor substrate comprises a wide portion and a narrow portion that are arranged alternately between the first trench and the second trench, the narrow portion being a portion where an interval between the first trench and the second trench is narrower than an interval between the first trench and the second trench in the wide portion,
 the interlayer insulating layer comprises a contact hole in the wide portion,
 the first electrode is in contact with the semiconductor substrate within the contact hole, and the semiconductor substrate comprises:
an upper n-type region extending from the wide portion to the narrow portion, in contact with the first gate insulating layer and the second gate insulating layer in the narrow portion, and in contact with the first electrode within the contact hole in the wide portion;
a p-type body contact region in contact with the first electrode within the contact hole in the wide portion;
a p-type body region in contact with the first gate insulating layer and the second gate insulating layer under the upper n-type region in the narrow portion, connected to the body contact region, and having a p-type impurity concentration lower than a p-type impurity concentration of the body contact region; and
a lower n-type region in contact with the first gate insulating layer and the second gate insulating layer under the body region in the narrow portion and in contact with the second electrode.

2. The switching element as in claim 1, wherein
the body region and the lower n-type region extend from the wide portion to the narrow portion, and
the semiconductor substrate further comprises:
a first bottom p-type region in contact with the first gate insulating layer at a bottom surface of the first trench;
a second bottom p-type region in contact with the second gate insulating layer at a bottom surface of the second trench;
a first connecting p-type region extending along a lateral surface of the first trench in the wide portion and connecting between the body region and the first bottom p-type region; and
a second connecting p-type region extending along a lateral surface of the second trench in the wide portion and connecting between the body region and the second bottom p-type region.

3. The switching element as in claim 1, wherein
the semiconductor substrate is a SiC substrate, and
a thickness of the body region between the upper n-type region and the lower n-type region is equal to or less than 1 micrometer in a range where the body region is in contact with the first gate insulating layer and in a range where the body region is in contact with the second gate insulating layer.

4. A method of manufacturing a switching element, the method comprising:
forming a first trench and a second trench in an upper surface of a semiconductor substrate, the second trench being arranged to be apart from the first trench; and
enlarging widths of the first trench and the second trench in an etching region by setting the etching region such that the etching region and a non-etching region are arranged alternately along a longitudinal direction of the first trench and the second trench and by etching a lateral surface of the first trench and a lateral surface of the second trench in the etching region, wherein a narrow portion is formed between the first trench and the second trench in the etching region, the narrow portion is a portion where an interval between the first trench and the second trench is narrower than an interval between the first trench and the second trench in a wide portion positioned between the first trench and the second trench in the non-etching region,
wherein the switching element to be manufactured includes:
a first gate insulating layer covering an inner surface of the first trench;
a second gate insulating layer covering an inner surface of the second trench;
a first gate electrode arranged in the first trench and insulated from the semiconductor substrate by the first gate insulating layer;
a second gate electrode arranged in the second trench and insulated from the semiconductor substrate by the second gate insulating layer,
an interlayer insulating layer covering an upper surface of the first gate electrode, an upper surface of the second gate electrode, and the upper surface of the semiconductor substrate, and including a contact hole in the wide portion;
a first electrode arranged on the interlayer insulating layer and in contact with the semiconductor substrate within the contact hole; and
a second electrode,
wherein the semiconductor substrate of the switching element to be manufactured includes:
an upper n-type region extending from the wide portion to the narrow portion, in contact with the first gate insulating layer and the second gate insulating layer in the narrow portion, and in contact with the first electrode within the contact hole in the wide portion;
a p-type body contact region in contact with the first electrode within the contact hole in the wide portion;
a p-type body region in contact with the first gate insulating layer and the second gate insulating layer under the upper n-type region in the narrow portion, connected to the body contact region, and having a p-type impurity concentration lower than a p-type impurity concentration of the body contact region; and
a lower n-type region in contact with the first gate insulating layer and the second gate insulating layer on under the body region in the narrow portion and in contact with the second electrode.

5. The method as in claim 4 further comprising:
forming a first connecting p-type region extending along the lateral surface of the first trench and a second connecting p-type region extending along the lateral surface of the second trench by implanting p-type impurities to the lateral surface of the first trench and the lateral surface of the second trench before the enlarging of the widths of the first trench and the second trench in the etching region; and
forming a first bottom p-type region located at a bottom surface of the first trench and a second bottom p-type region located at a bottom surface of the second trench by implanting p-type impurities to the bottom surface of the first trench and the bottom surface of the second trench,
wherein the enlarging of the widths of the first trench and the second trench in the etching region comprises removing the first connecting p-type region and the second connecting p-type region in the etching region by etching, and
wherein in the switching element to be manufactured,
the body region and the lower n-type region extend from the wide portion to the narrow portion,
the first connecting p-type region connects between the body region and the first bottom p-type region in the wide portion, and
the second connecting p-type region connects between the body region and the second bottom p-type region in the wide portion.

6. The method as in claim 4, wherein
the semiconductor substrate is a SiC substrate, and in the switching element to be manufactured, a thickness of the body region between the upper n-type region and the lower n-type region is equal to or less than 1 micrometer in a range where the body region is in contact with the first gate insulating layer and in a range where the body region is in contact with the second gate insulating layer.

* * * * *